United States Patent
Kuroda et al.

(10) Patent No.: US 8,164,938 B2
(45) Date of Patent: Apr. 24, 2012

(54) SEMICONDUCTOR MEMORY DEVICE

(75) Inventors: Naoki Kuroda, Osaka (JP); Yoshinobu Yamagami, Osaka (JP)

(73) Assignee: Panasonic Corporation, Osaka (JP)

( * ) Notice: Subject to any disclaimer, the term of this patent is extended or adjusted under 35 U.S.C. 154(b) by 39 days.

(21) Appl. No.: 12/942,627

(22) Filed: Nov. 9, 2010

(65) Prior Publication Data

US 2011/0051489 A1 Mar. 3, 2011

Related U.S. Application Data

(63) Continuation of application No. PCT/JP2010/000646, filed on Feb. 3, 2010.

(30) Foreign Application Priority Data

May 25, 2009 (JP) .................................. 2009-125272

(51) Int. Cl.
G11C 5/06 (2006.01)
(52) U.S. Cl. ........................................... 365/72; 365/63
(58) Field of Classification Search ..................... 365/72, 365/63
See application file for complete search history.

(56) References Cited

U.S. PATENT DOCUMENTS

| 4,821,233 | A | 4/1989 | Hsieh | |
|---|---|---|---|---|
| 6,977,858 | B2* | 12/2005 | Osada et al. | 365/222 |
| 7,499,312 | B2* | 3/2009 | Matick et al. | 365/154 |
| 7,782,655 | B2* | 8/2010 | Shau | 365/154 |
| 7,821,858 | B2* | 10/2010 | Matick et al. | 365/207 |
| 7,864,600 | B2* | 1/2011 | Mikan et al. | 365/189.14 |
| 8,111,579 | B2* | 2/2012 | De et al. | 365/230.05 |
| 2004/0165414 | A1 | 8/2004 | Kushida | |
| 2005/0018519 | A1 | 1/2005 | Nii | |
| 2007/0242498 | A1* | 10/2007 | Chandrakasan et al. | 365/154 |

FOREIGN PATENT DOCUMENTS

| JP | 63-205890 | 8/1988 |
|---|---|---|
| JP | 02-024897 | 1/1990 |
| JP | 2004-259352 | 9/2004 |
| JP | 2005-044456 | 2/2005 |

* cited by examiner

*Primary Examiner* — Tuan T. Nguyen
(74) *Attorney, Agent, or Firm* — McDermott Will & Emery LLP

(57) ABSTRACT

A semiconductor memory device includes a first inverter and a second inverter each having an input and an output, the output of each of the first and second inverters being connected to the input of the other so that data is stored, a CMOS switch configured to connect the input of the first inverter and a write bit line, a read MOS transistor having a gate connected to the output of the first inverter, and a MOS switch configured to connect the read MOS transistor to a read bit line. The first and second inverters have different sizes and are connected to different source power supplies.

10 Claims, 7 Drawing Sheets

SEMICONDUCTOR MEMORY DEVICE

CROSS-REFERENCE TO RELATED APPLICATIONS

This is a continuation of PCT International Application PCT/JP2010/000646 filed on Feb. 3, 2010, which claims priority to Japanese Patent Application No. 2009-125272 filed on May 25, 2009. The disclosures of these applications including the specifications, the drawings, and the claims are hereby incorporated by reference in their entirety.

BACKGROUND

The present disclosure relates to semiconductor memory devices, and more particularly, to multiport memories having a function of simultaneously performing read operation and write operation.

There is a known multiport memory in which write operation and read operation are performed via different bit lines, whereby a memory cell current is reduced (see, for example, Japanese Patent Publication No. S63-205890 (FIG. 3)).

SUMMARY

The write assist function, which decreases the voltage of a memory cell during data write operation to facilitate the write operation to the memory cell, is used in one-port memories, particularly a one-port static random access memory (SRAM), so as to support an advance in microfabrication technology. The aforementioned conventional multiport memory does not have the write assist function, and therefore, has a problem that even when microfabrication technology for semiconductor processes is advanced, the size of memory cells cannot be reduced by the advance of microfabrication technology as much as in the one-port SRAM memory cell. Specifically, the performance of write operation is determined by the performance of an N-channel MOS transistor connected to a write bit line, and therefore, the size of the N-channel MOS transistor needs to be increased. Therefore, in order to improve the data holding characteristic of a memory cell which is connected to a select word line and is not accessed, there is no other way than conversely decreasing the performance of the N-channel MOS transistor or increasing the performance of inverters included in the memory cell. As a result, there is a problem that the memory cell size cannot be reduced.

Moreover, when the write assist function is imparted to a memory cell in the conventional art, there is the following problem. When write operation is performed at the same time of or closely in time to read operation, then if the source voltage of a memory cell is decreased so that the write operation is performed with respect to the memory cell, and the read operation is performed with respect to another memory cell connected to the same source power supply for that memory cell, the gate voltage of an N-channel MOS transistor on the read port side decreases, and therefore, data cannot be read out at a high speed.

The detailed description describes implementations of a multiport memory in which the memory cell size can be reduced according to an advance in microfabrication technology for semiconductor processes, and read operation can be performed at a high speed.

An example semiconductor memory device of the present disclosure includes a first inverter and a second inverter each having an input and an output, the output of each of the first and second inverters being connected to the input of the other so that data is stored, a first MOS switch configured to connect the input of the first inverter and a write bit line, a first MOS transistor having a gate connected to the output of the first inverter, and a second MOS switch configured to connect the first MOS transistor to a read bit line. The first MOS switch is a CMOS switch including a P-channel MOS transistor and an N-channel MOS transistor. The first and second inverters have different sizes, a source power supply to a P-channel MOS transistor included in the second inverter is different from a source power supply to a P-channel MOS transistor included in the first inverter, and a source power supply to an N-channel MOS transistor included in the second inverter is different from a source power supply to an N-channel MOS transistor included in the first inverter. The first MOS transistor may be an N-channel MOS transistor. The second inverter may be larger than the first inverter.

As a result, the assist function can be achieved during data write operation by controlling one of the power supplies to the first and second inverter. In addition, by setting the performance ratio of the slave one of the two inverters which determine data holding performance to be smaller, data write operation can be facilitated. Moreover, during data read operation, the gate voltage of the first MOS transistor connected to the read port is not decreased from a power supply voltage irrespective of the write assist function, and therefore, high-speed read operation can be achieved.

A source power supply circuit for the second inverter may be provided for each of the write bit lines connected to the first MOS switch. As a result, the degradation in the data holding characteristic of a non-selected memory cell can be reduced or prevented.

The source power supply circuit may supply two resistance ratio-dependent voltages between a power supply voltage and a ground voltage. As a result, the write assist function is effective.

The source power supply circuit may be controlled in accordance with a write control signal, and in a first operating state, may supply the resistance ratio-dependent voltages between the power supply voltage and the ground voltage, and in a second operating state, may supply the power supply voltage to a source of the P-channel MOS transistor included in the second inverter, and the ground voltage to a source of the N-channel MOS transistor included in the second inverter. As a result, by causing the assist function to be enabled only during write operation, the degradation in the data holding characteristic can be reduced or prevented during the time that write operation is not performed.

The first MOS transistor may be a P-channel MOS transistor. As a result, even when the write assist function of the second inverter is so high that the output voltage of the first inverter exceeds the ground voltage, i.e., the gate voltage of the P-channel MOS transistor for the read port is higher than the ground voltage, then if the threshold voltage of the P-channel MOS transistor is not exceeded, data is not erroneously read out.

The semiconductor memory device may further include a precharge circuit configured to precharge the write bit line connected to the input of the first inverter to an intermediate voltage between the power supply voltage not inclusive and the ground voltage not inclusive. The intermediate voltage may be ½ of VDD where VDD is the power supply voltage. As a result, it is possible to reduce or prevent the degradation in the data holding characteristic due to an influence of the write bit line connected to the CMOS switch. In particular, since data connected to the select word line is not rewritten, the degradation in the data holding characteristic of a memory cell can be reduced or prevented.

Another example semiconductor memory device includes a data holding circuit configured to store data using a first circuit element and a second circuit element having different sizes and connected to different power supplies, a CMOS switch including a P-channel MOS transistor and an N-channel MOS transistor and configured to connect the data holding circuit and a bit line, and a read circuit configured to read the data of the data holding circuit. As a result, the assist function can be achieved during data write operation by controlling one of the power supplies to the circuit elements in the data holding circuit. In addition, by setting the performance ratio of the slave one of the two circuit elements which determine data holding performance to be smaller, data write operation can be facilitated.

According to the present disclosure, the size of a memory cell in a multiport memory can be reduced according to an advance in microfabrication technology for semiconductor processes, and high-speed or stable read operation can be achieved.

DETAILED DESCRIPTION

Figure 1:
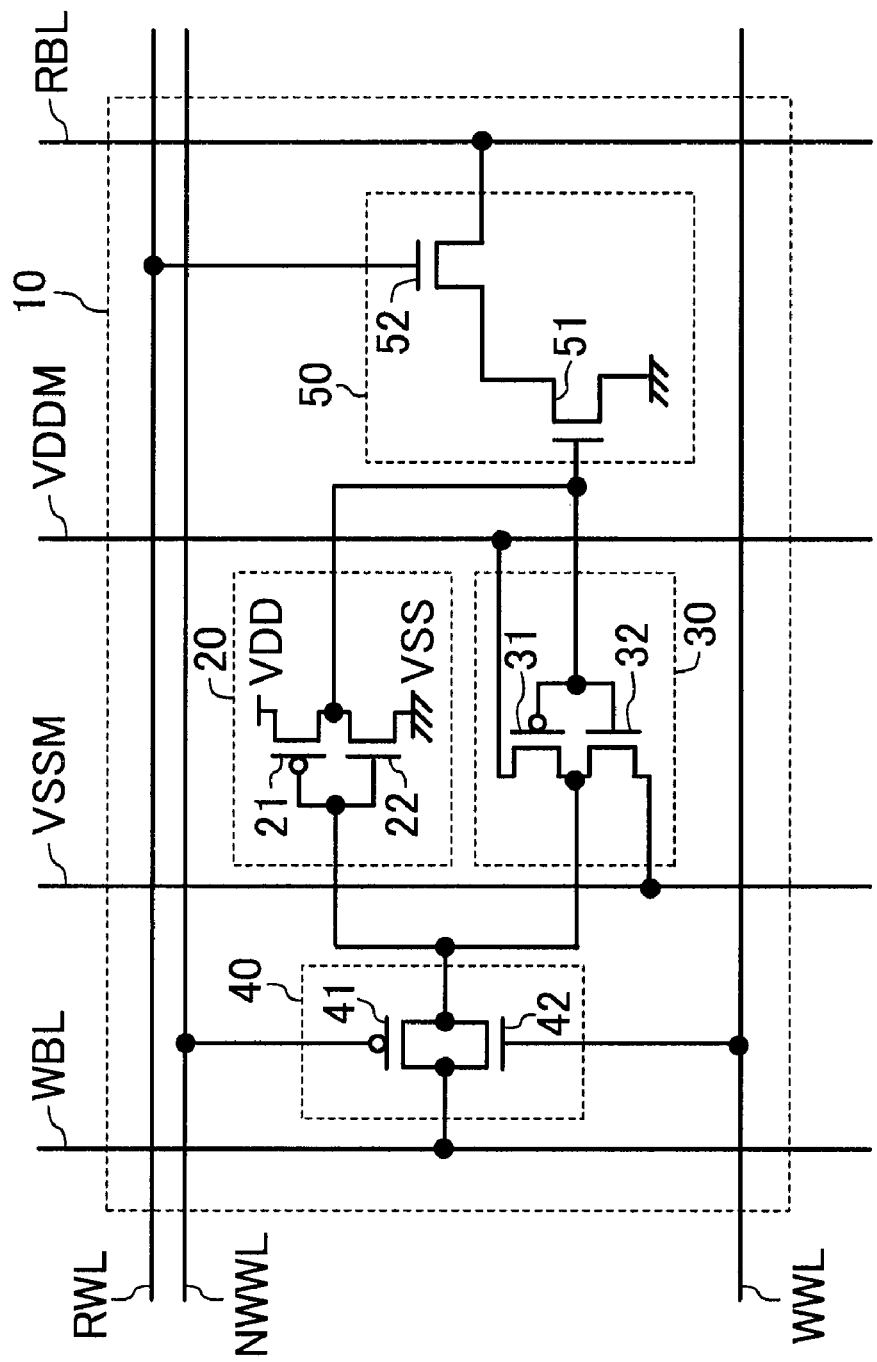
FIG. 1 is a circuit diagram showing a cell configuration of a semiconductor memory device according to a first embodiment of the present disclosure.

Embodiments of the present disclosure will be described in detail hereinafter with reference to the accompanying drawings. Note that like parts are indicated by like reference characters throughout the specification.

First Embodiment

FIG. 1 shows a cell configuration of a semiconductor memory device according to the first embodiment of the present disclosure. The semiconductor memory device of FIG. 1 is a multiport SRAM including memory cells 10 each having a write port and a read port which are separated from each other. The memory cell 10 includes a first inverter 20 including a P-channel MOS transistor 21 and an N-channel MOS transistor 22, a second inverter 30 including a P-channel MOS transistor 31 and an N-channel MOS transistor 32, a CMOS switch 40 including a P-channel MOS transistor 41 and an N-channel MOS transistor 42, and a read circuit 50 including a read N-channel MOS transistor 51 and an N-channel MOS switch 52.

An output of each of the first and second inverters 20 and 30 is connected to an input of the other so that data is stored. The second inverter 30 is larger than the first inverter 20. The source of the P-channel MOS transistor 21 included in the first inverter 20 is connected to a power supply voltage VDD. The source of the N-channel MOS transistor 22 included in the first inverter 20 is connected to a ground voltage VSS. The source of the P-channel MOS transistor 31 included in the second inverter 30 is connected to a power supply VDDM. The source of the N-channel MOS transistor 32 included in the second inverter 30 is connected to a power supply VSSM.

A reference character WBL indicates a write bit line. The CMOS switch 40 is configured to connect the input of the first inverter 20 to the write bit line WBL. A reference character WWL indicates a write word line for controlling the N-channel MOS transistor 42 of the CMOS switch 40. A reference character NWWL indicates a write word line for controlling the P-channel MOS transistor 41 of the CMOS switch 40.

A reference character RBL indicates a read bit line. The output of the first inverter 20 is connected to the gate of the read N-channel MOS transistor 51, and the drain of the read N-channel MOS transistor 51 is connected via the N-channel MOS switch 52 to the read bit line RBL, where the read N-channel MOS transistor 51 and the N-channel MOS switch 52 are connected in series. A reference character RWL indicates a read word line for controlling the N-channel MOS switch 52.

Figure 2:
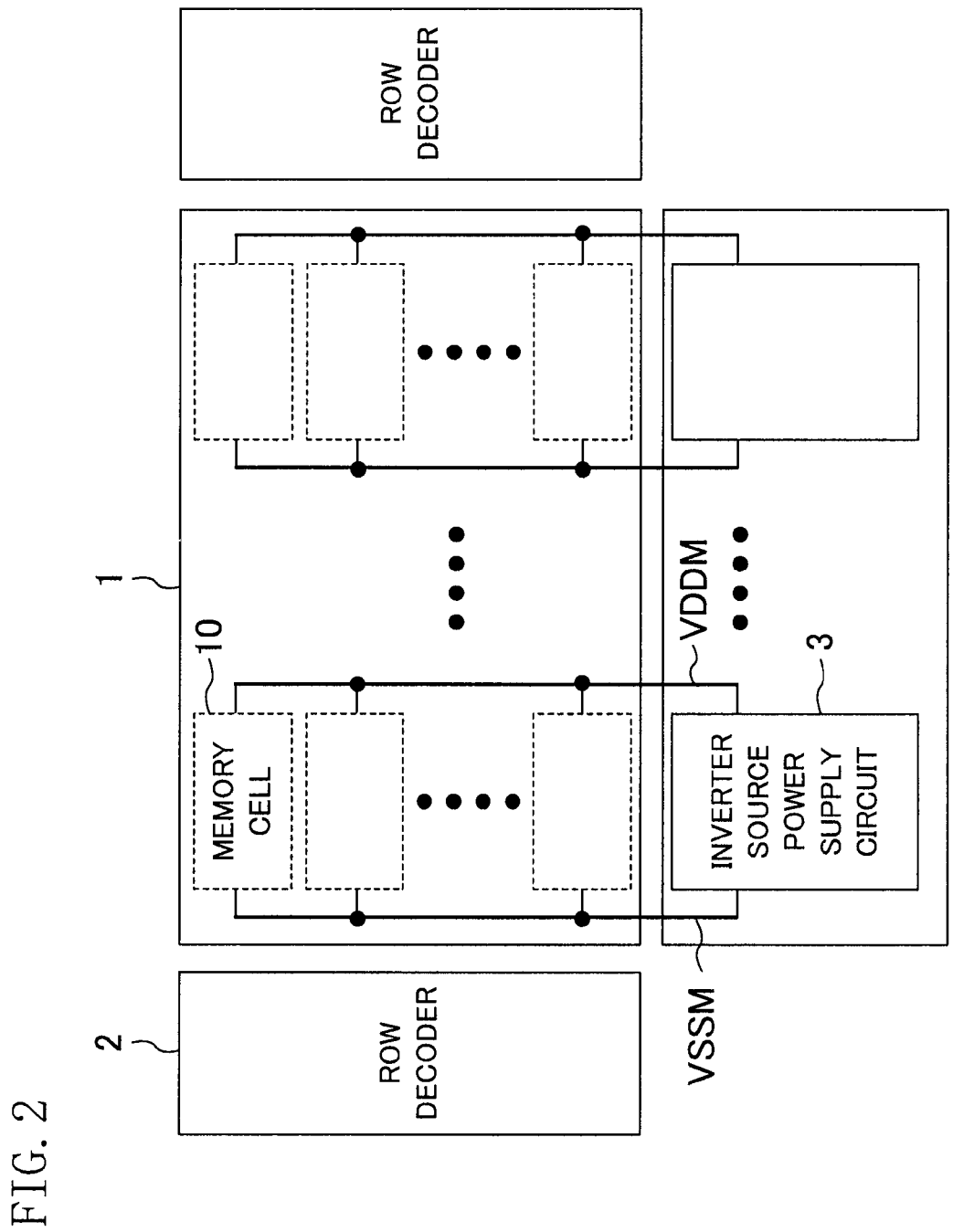
FIG. 2 is a block diagram showing a main configuration of the semiconductor memory device of the first embodiment of the present disclosure.

FIG. 2 shows a main configuration of the semiconductor memory device of the first embodiment of the present disclosure. FIG. 2 shows a memory cell array 1, row decoders 2, and inverter source power supply circuits 3. The memory cell array 1 includes a large number of the memory cells 10 each having the configuration of FIG. 1, which are arranged in a matrix. The inverter source power supply circuit 3 supplies the power supply VDDM to the source of the P-channel MOS transistor 31 included in the second inverter 30, and the power supply VSSM to the source of the N-channel MOS transistor 32 included in the second inverter 30. The inverter source power supply circuit 3 is provided for each write bit line WBL connected to the CMOS switch 40.

Figure 3:
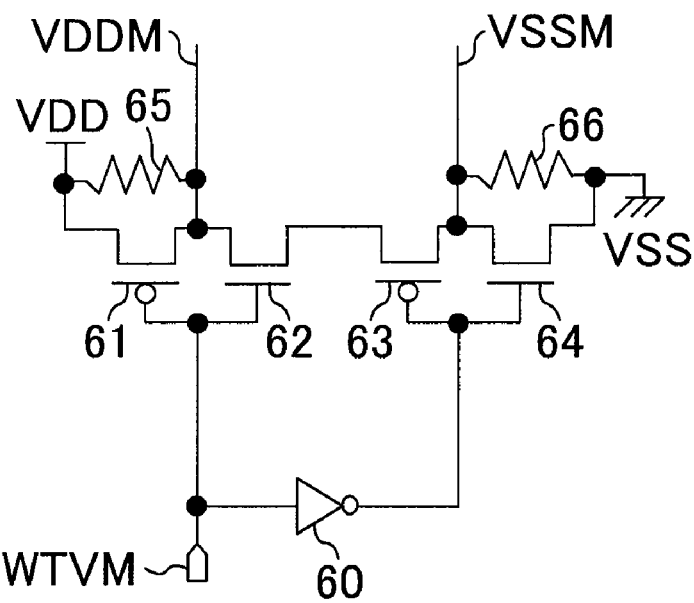
FIG. 3 is a circuit diagram showing a specific example inverter source power supply circuit in the semiconductor memory device of the first embodiment of the present disclosure.

FIG. 3 shows a specific example of the inverter source power supply circuit 3 in the semiconductor memory device of the first embodiment of the present disclosure. The inverter source power supply circuit 3 of FIG. 3 includes an inverter circuit 60, P-channel MOS transistors 61 and 63, N-channel MOS transistors 62 and 64, and resistors 65 and 66. The inverter source power supply circuit 3 is activated in accordance with a write control signal WTVM to supply, as the source power supplies VDDM and VSSM to the second inverter 30, a resistance ratio-dependent voltage between the power supply voltage VDD and the ground voltage VSS. When it is inactive, the inverter source power supply circuit 3 sets the source voltage of the P-channel MOS transistor 31 to the power supply voltage VDD, and the source voltage of the N-channel MOS transistor 32 to the ground voltage VSS.

Figure 4:
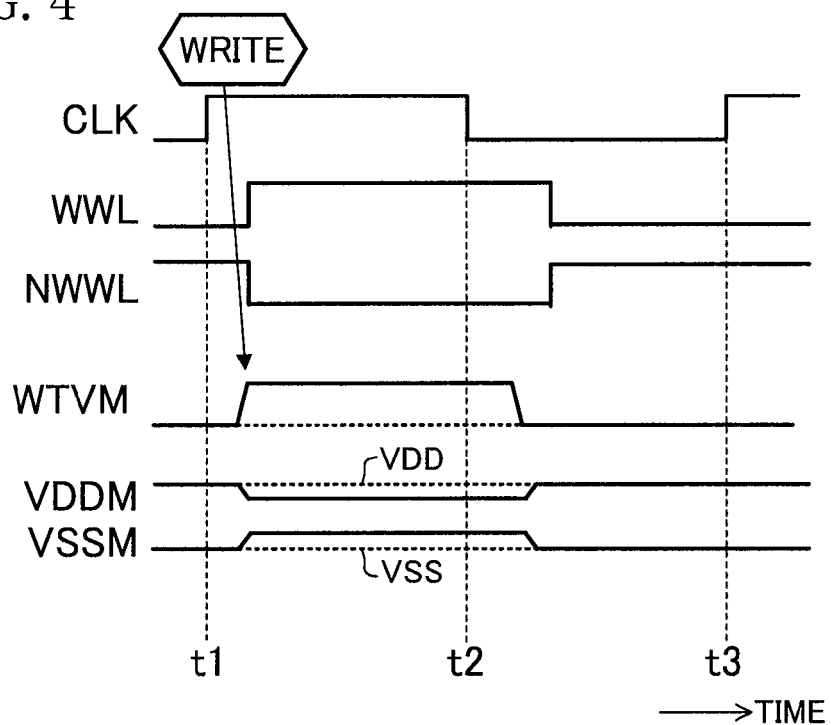
FIG. 4 is a timing chart showing write operation of the semiconductor memory device of the first embodiment of the present disclosure.

Next, write operation will be described with reference to FIG. 4. During write operation, at time t1, when a WRITE command is externally input in synchronization with rising of a clock signal CLK, the write word lines WWL and NWWL corresponding to a desired address are activated, and at the same time, data is transferred from the write bit line WBL via the CMOS switch 40. In this case, the write control signal WTVM internally generated is activated in accordance with the WRITE command, so that the source power supply VDDM of the P-channel MOS transistor 31 of the second inverter 30 is changed to a voltage which is decreased from the power supply voltage VDD, and the source power supply VSSM of the N-channel MOS transistor 32 of the second inverter 30 is changed to a voltage which is increased from the ground voltage VSS, thereby providing the write assist function. Here, write operation which rewrites data held in the memory cell 10 is achieved by a write buffer (not shown) provided for the write bit line WBL exceeding a performance which is the cascade combination of the performance of the CMOS switch 40 and the performance of the second inverter 30. Note that each signal returns to the original state after falling of the clock signal CLK at time t2, and waits for the next rising at time t3 of the clock signal CLK.

As described above, write operation can be facilitated by controlling the source voltages of the transistors 31 and 32 to decrease the performance of the second inverter 30. Since the transistors 41 and 42 used in the CMOS switch 40 typically have a larger size than that of the transistors 31 and 32 used in the second inverter 30, the assist function for write operation which is achieved by the aforementioned control is considerably effective. By causing the first inverter 20 to be smaller than the second inverter 30, the data holding performance of the memory cell 10 can be decreased, whereby write operation can be further facilitated. As a result, write operation can be performed without increasing the performance of the CMOS switch 40 which is connected in cascade to the second inverter 30, depending on the performance of the second inverter 30, and therefore, the size of the CMOS switch 40 does not need to be increased, resulting in a reduction in the memory cell area. Moreover, since write operation can be performed without increasing the performance of the CMOS switch 40, there is an advantage that a memory cell which is connected to the selected write word lines WWL and NWWL and to which write operation is not to be performed has a satisfactory data holding characteristic. Specifically, if the performance of the CMOS switch 40 is increased, erroneous operation caused by external disturbance from the write bit line WBL can be advantageously reduced or prevented. Moreover, when the second inverter 30 is performing the assist function, the first inverter 20 can substantially hold data, and the size of the first inverter 20 can be decreased while ensuring the data holding characteristic of a memory cell which is connected to the selected write word lines WWL and NWWL and to which write operation is not to be performed, resulting in a further contribution to the reduction in the memory cell area.

Figure 5:
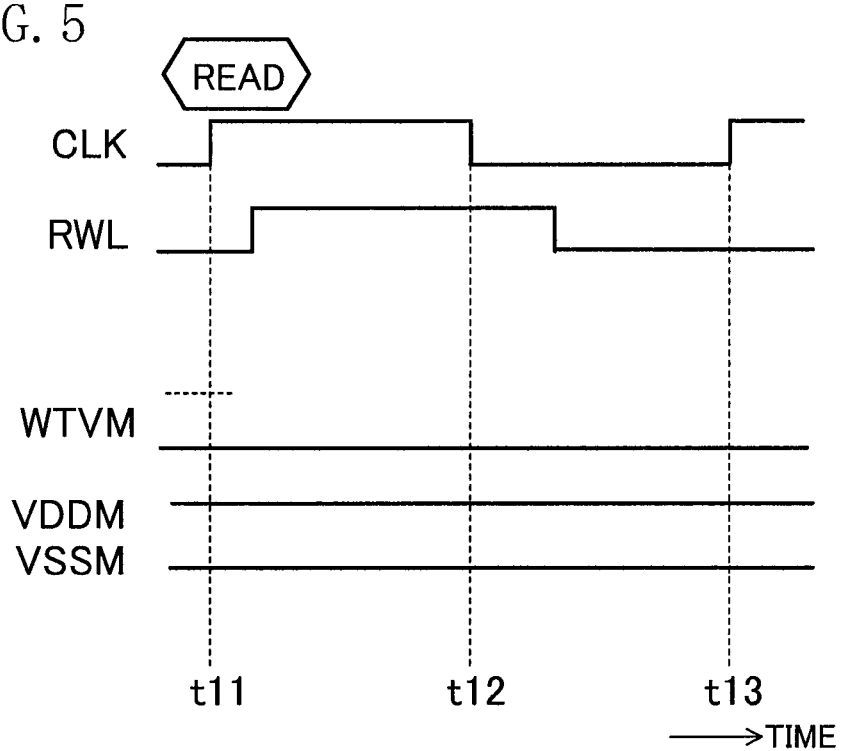
FIG. 5 is a timing chart showing read operation of the semiconductor memory device of the first embodiment of the present disclosure.

Next, read operation will be described with reference to FIG. 5. During read operation, at time t11, when a READ command is externally input in synchronization with rising of the clock signal CLK, the read word line RWL corresponding to a desired address is activated. In this case, if the gate voltage of the read N-channel MOS transistor 51, i.e., the output voltage of the first inverter 20 is level '1,' data '0' is read out onto the read bit line RBL precharged at level '1,' and if the output voltage of the first inverter 20 is level '0,' data '1' is read out onto the read bit line RBL. Note that the signal on the read word line RWL returns to the original state after falling of the clock signal CLK at time t12, and waits for the next rising at time t13 of the clock signal CLK.

As described above, the read circuit 50 is configured to detect only the voltage level of held data to read the data, and therefore, even if the first inverter 20 is smaller than the second inverter 30, the read speed is not degraded. Any circuit configuration in which the read circuit 50 detects a voltage level to read data can be used.

Next, when read operation and write operation are performed simultaneously or closely in time to each other, and therefore, the memory cells 10 on the same bit line are accessed during the same period of time, write assist operation which controls the source voltages of the second inverter 30 to VDDM and VSSM is performed. Note that, also during read operation with respect to the memory cell 10 on a bit line for which write assist operation is being performed, only the second inverter 30 is assisted, and the source voltages of the first inverter 20 are the power supply voltage VDD and the ground voltage VSS, and therefore, the gate voltage of the read N-channel MOS transistor 51 can also be caused to be either the power supply voltage VDD or the ground voltage VSS, whereby the read speed of, particularly, level '1' can be increased.

A switch linking the write bit line WBL and the input of the first inverter 20 is the CMOS switch 40, and the write bit line WBL has a single bit line configuration which writes levels '1' and '0' instead of the complementary configuration. In this case, the assist function which controls the source voltages of the first inverter 20 and is required for facilitation of write operation in the conventional art, is no longer required. As a result, the gate voltage of the read N-channel MOS transistor 51 can be caused to be the power supply voltage VDD or the ground voltage VSS during read operation, whereby the read speed can be increased.

Figure 6:
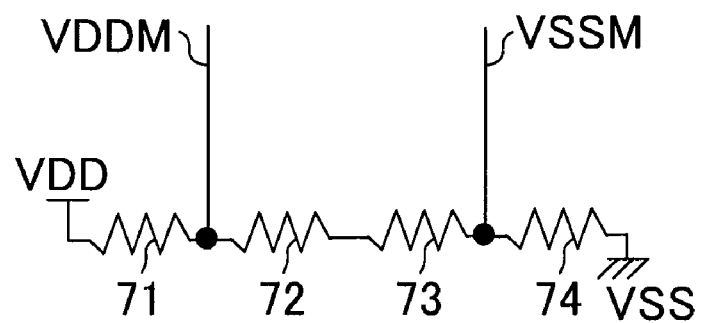
FIG. 6 is a circuit diagram showing another specific example inverter source power supply circuit in the semiconductor memory device of the first embodiment of the present disclosure.

FIG. 6 shows another specific example of the inverter source power supply circuit 3 in the semiconductor memory device of the first embodiment of the present disclosure. The inverter source power supply circuit 3 of FIG. 6 includes resistors 71, 72, 73, and 74 connected in series between the power supply voltage VDD and the ground voltage VSS. The source power supplies VDDM and VSSM are extracted from intermediate nodes between the resistors 71, 72, 73, and 74. As a result, the source voltages of the second inverter 30 are reverse biases, and therefore, the inverter performance can be reduced. While, in FIG. 6, the resistors are used, MOS transistors may be used to provide a similar function.

Figure 7:
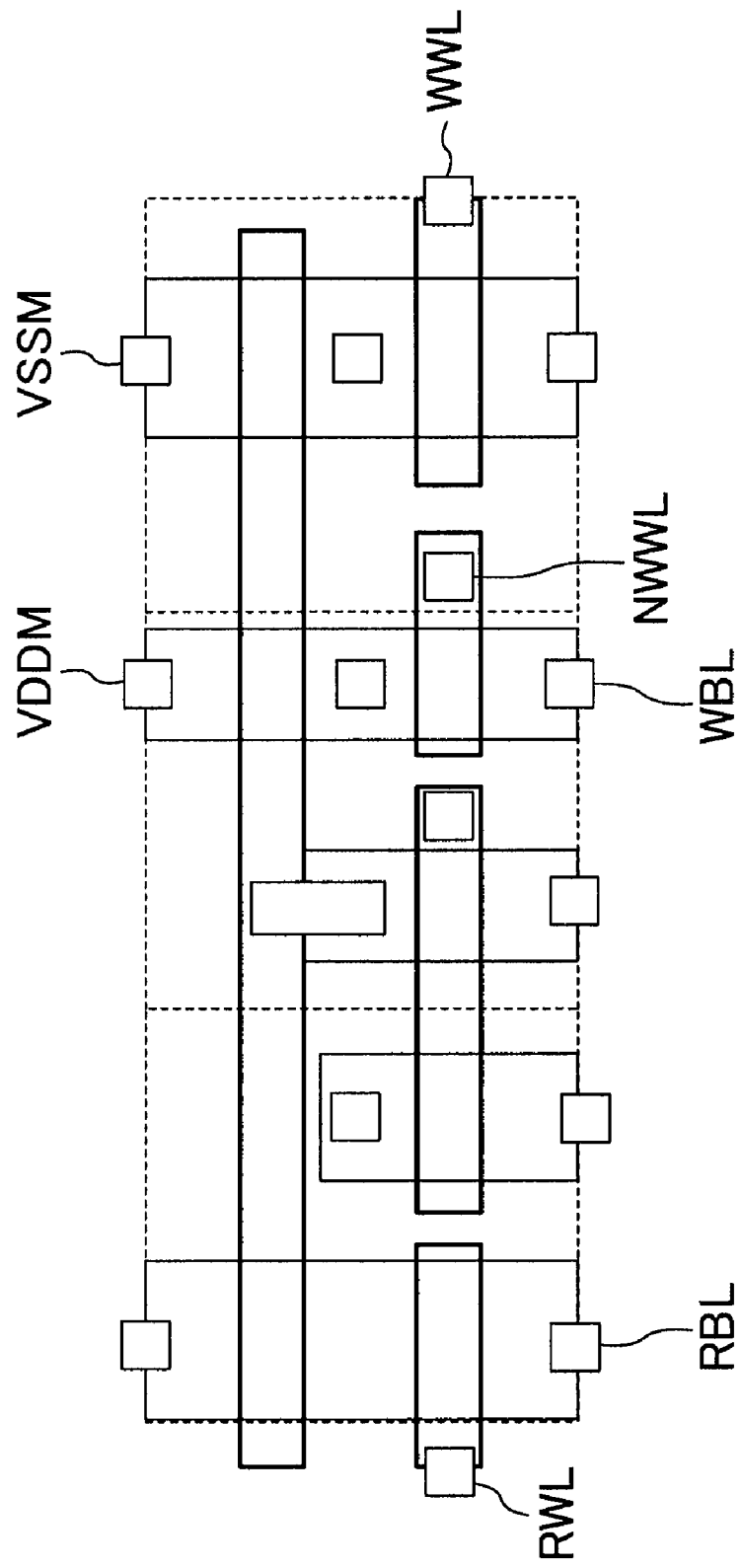
FIG. 7 is a plan view showing an example layout of the semiconductor memory device of the first embodiment of the present disclosure.

FIG. 7 shows an example layout of the semiconductor memory device of the first embodiment of the present disclosure. As shown in the layout of FIG. 7, for example, the P-channel MOS transistor 41 of the CMOS switch 40 is provided in the same column as that of the diffusion layer of the P-channel MOS transistor 31 of the second inverter 30 so that the diffusion layer can be composed of five blocks, resulting in a reduction in the memory cell area. Note that any layout in which the diffusion layer can be composed of five blocks may be used.

Note that, as shown in FIG. 2, the inverter source power supply circuit 3 which supplies the source power supplies VDDM and VSSM to the second inverter 30 is provided for each write bit line WBL. As a result, the assist function of the memory cell 10 can be controlled in units of a bit line via which write operation is performed, and therefore, the degradation in the data holding characteristic of a memory cell for which write operation is not performed can be minimized. Alternatively, the inverter source power supply circuit 3 may be provided for each unit which can be decoded using a column address including a bit line, i.e., the inverter source power supply circuits 3 may be simultaneously controlled in units of a plurality of the read bit lines RBL. In this case, this arrangement is effective to the reduction in the layout area if the degradation of the data holding characteristic does not affect the yield or the like.

According to the inverter source power supply circuit 3 of FIG. 3, the assist function which is required only during write operation can be achieved, and during the other time periods, by maximizing the performance of the second inverter 30, the degradation of the data holding performance is reduced or prevented. Note that the example circuit of FIG. 3 is only for illustrative purposes. Any circuit configuration may be used in which the function of supplying a resistance ratio-dependent voltage between the power supply voltage VDD and the ground voltage VSS in accordance with the write control signal WTVM is provided, and in addition, the function of setting the source voltage of the P-channel MOS transistor 31 to the power supply voltage VDD and the source voltage of the N-channel MOS transistor 32 to the ground voltage VSS is provided.

While the multiport SRAM described in this embodiment has a write port and a read port which are separated from each other, the write port may be used as a write and read port.

Second Embodiment

Figure 8:
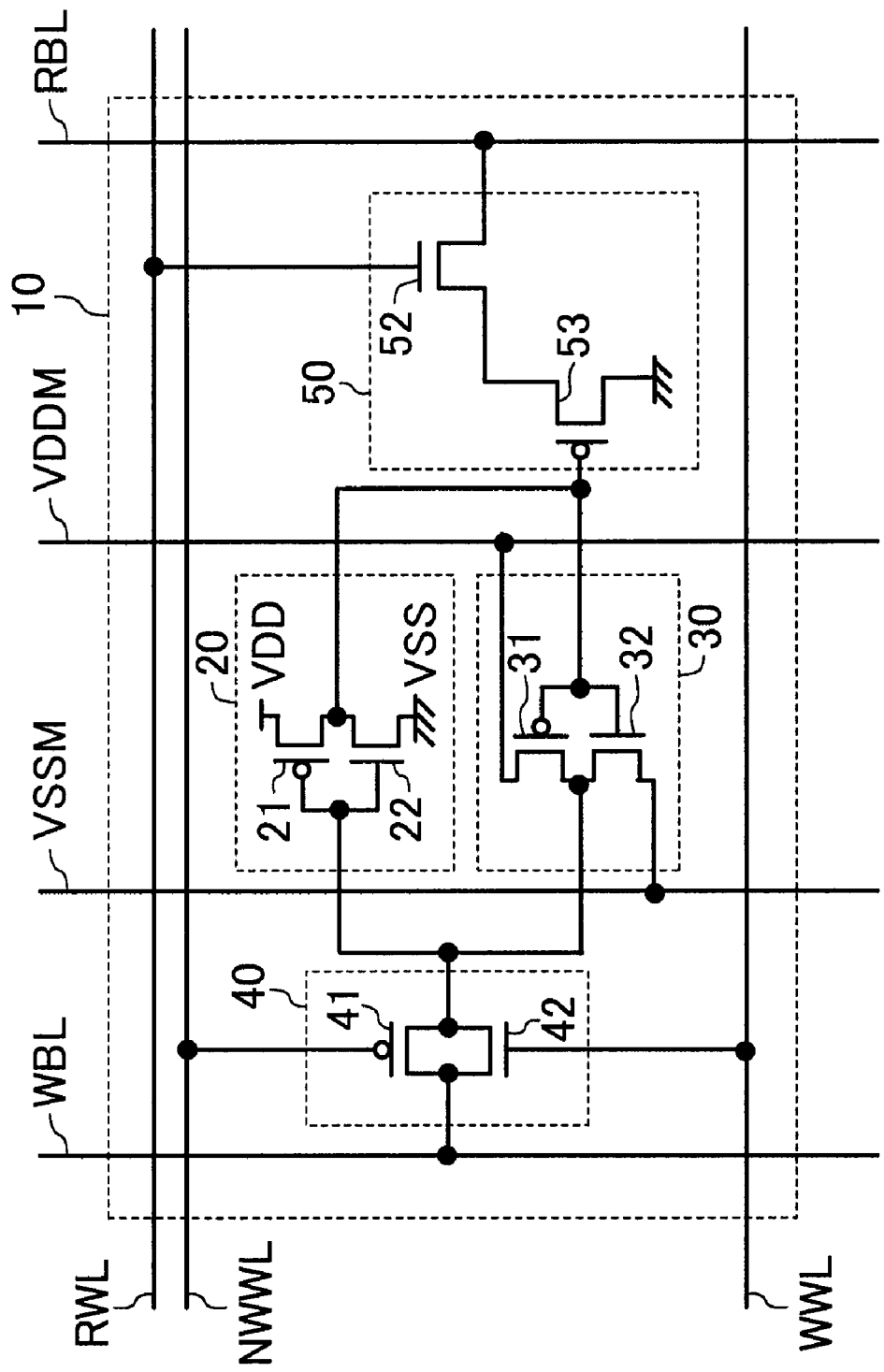
FIG. 8 is a circuit diagram showing a cell configuration of a semiconductor memory device according to a second embodiment of the present disclosure.

FIG. 8 shows a cell configuration of a semiconductor memory device according to a second embodiment of the present disclosure. A memory cell 10 of FIG. 8 is the same as that of FIG. 1, except that the N-channel MOS transistor 51 in the read circuit 50 is replaced with a P-channel MOS transistor 53.

According to the second embodiment, the source voltages of the first inverter 20 are the power supply voltage VDD and the ground voltage VSS. Therefore, the gate voltage of the read P-channel MOS transistor 53 can also be caused to be either the power supply voltage VDD or the ground voltage VSS, and in addition, even when the output level of the first inverter 20 cannot be caused to be substantially VDD or VSS by the assist function of the second inverter 30, i.e., the P-channel MOS transistor 21 and the N-channel MOS transistor 22 of the first inverter 20 are simultaneously activated, the read circuit 50 does not perform read operation until the threshold voltage of the P-channel MOS transistor 53 is exceeded, whereby erroneous read operation can be reduced or prevented. The second embodiment is particularly effective when the power supply voltage VDD is low.

Note that the layout of the multiport SRAM of FIG. 8 is also effective when the diffusion layer is composed of five blocks as in the first embodiment.

Third Embodiment

Figure 9:
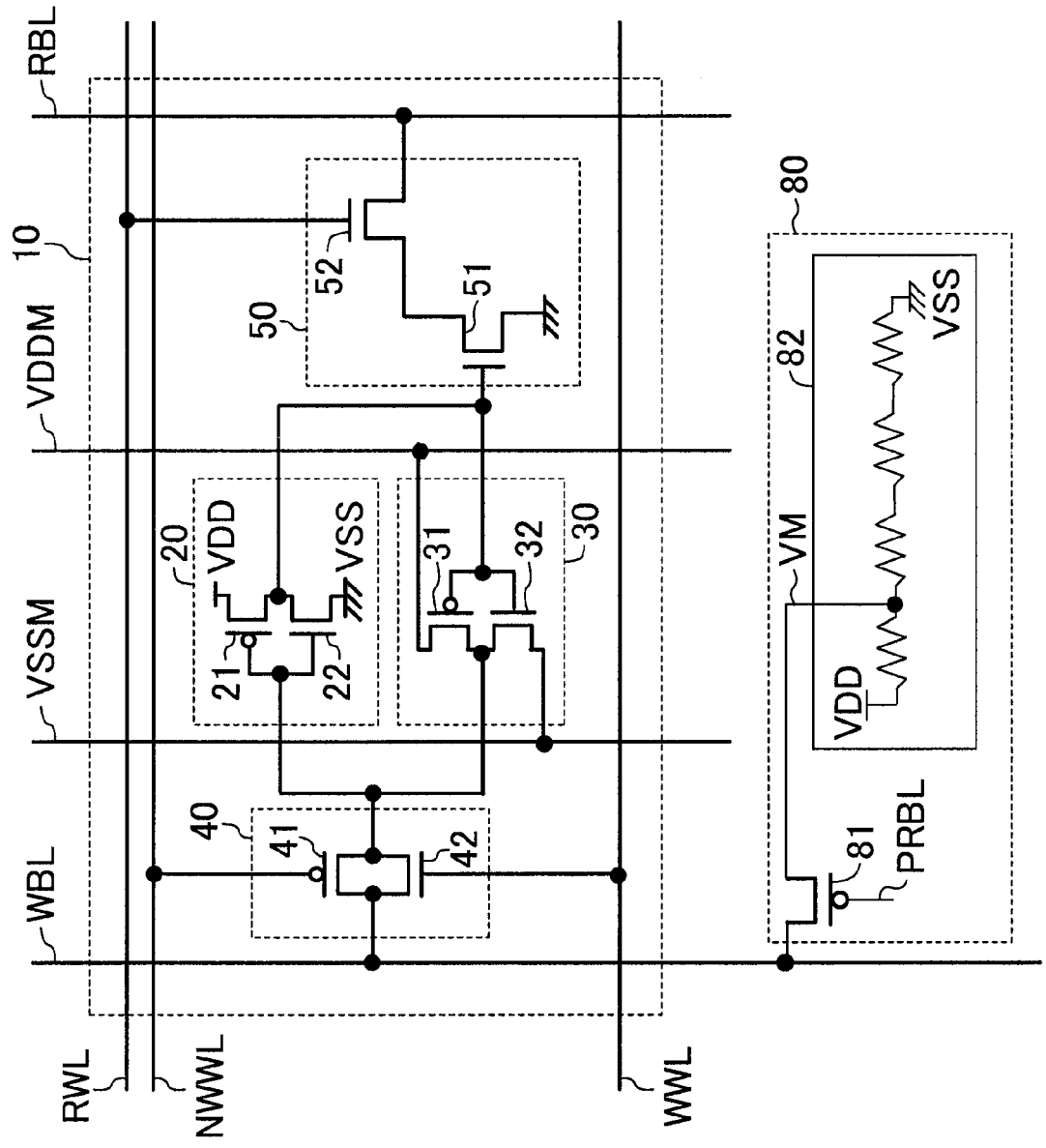
FIG. 9 is a circuit diagram showing a configuration of a semiconductor memory device according to a third embodiment of the present disclosure.

FIG. 9 shows a configuration of a semiconductor memory device according to a third embodiment of the present disclosure. The semiconductor memory device of FIG. 9 includes the memory cell 10 of the first embodiment in which a precharge circuit 80 is additionally provided. The precharge circuit 80 includes a write bit line precharge power supply circuit 82 which generates an internal voltage VM obtained at a resistance ratio from the power supply voltage VDD and the ground voltage VSS as a precharge intermediate voltage of the write bit line WBL, and a P-channel MOS transistor 81 which supplies the generated precharge intermediate voltage VM to the write bit line WBL.

In the semiconductor memory device of FIG. 9, a bit line precharge control signal PRBL transitions low during a period of time that write operation is not performed, whereby the write bit line WBL can be precharged to the internal voltage VM obtained at the resistance ratio between the power supply voltage VDD and the ground voltage VSS.

Thus, by causing the precharge voltage of the write bit line WBL to be different from the power supply voltage VDD and the ground voltage VSS, and be the internal voltage VM between the power supply voltage VDD and the ground voltage VSS, it is possible to reduce or prevent the degradation of the data holding characteristic due to the CMOS switch 40 when the write bit line WBL is the voltage VDD or VSS. The precharge voltage of the write bit line WBL can be adjusted to a voltage close to the low level when the performance of the P-channel MOS transistor 41 of the CMOS switch 40 is higher than that of the N-channel MOS transistor 42, and when not so, to a voltage close to the high level. While the write bit line precharge power supply circuit 82 of FIG. 9 includes resistors, MOS transistors may be used.

The precharge voltage of the write bit line WBL may be set to ½ of VDD. In this case, not only the data holding characteristic can be improved, but also data '1' and data '0' can be written to a bit line at the same speed. In addition, a current consumed by the write bit line WBL can be recycled, resulting in a reduction in the power consumption.

Note that the precharge circuit 80 of FIG. 9 can be connected to the memory cell 10 of the second embodiment.

The semiconductor memory device of the present disclosure can achieve a reduction in the memory cell size according to an advance in microfabrication technology for semiconductor processes even in the case of a multiport memory, and can perform high-speed read operation, and therefore, is useful for a system LSI including a large number of memories having a variety of specifications, and the like.

What is claimed is:

1. A semiconductor memory device comprising:
a first inverter and a second inverter each having an input and an output, the output of each of the first and second inverters being connected to the input of the other so that data is stored;
a first MOS switch configured to connect the input of the first inverter and a write bit line;
a first MOS transistor having a gate connected to the output of the first inverter; and
a second MOS switch configured to connect the first MOS transistor to a read bit line,
wherein
the first MOS switch is a CMOS switch including a P-channel MOS transistor and an N-channel MOS transistor, and
the first and second inverters have different sizes, a source power supply to a P-channel MOS transistor included in the second inverter is different from a source power supply to a P-channel MOS transistor included in the first inverter, and a source power supply to an N-channel MOS transistor included in the second inverter is different from a source power supply to an N-channel MOS transistor included in the first inverter.

2. The semiconductor memory device of claim 1, wherein the first MOS transistor is an N-channel MOS transistor.

3. The semiconductor memory device of claim 1, wherein the second inverter is larger than the first inverter.

4. The semiconductor memory device of claim 1, wherein a source power supply circuit for the second inverter is provided for each of the write bit lines connected to the first MOS switch.

5. The semiconductor memory device of claim 4, wherein the source power supply circuit supplies two resistance ratio-dependent voltages between a power supply voltage and a ground voltage.

6. The semiconductor memory device of claim 5, wherein the source power supply circuit is controlled in accordance with a write control signal, and in a first operating state, supplies the resistance ratio-dependent voltages between the power supply voltage and the ground voltage, and in a second operating state, supplies the power supply voltage to a source of the P-channel MOS transistor included in the second inverter, and the ground voltage to a source of the N-channel MOS transistor included in the second inverter.

7. The semiconductor memory device of claim 1, wherein the first MOS transistor is a P-channel MOS transistor.

8. The semiconductor memory device of claim 1, further comprising:
   a precharge circuit configured to precharge the write bit line connected to the input of the first inverter to an intermediate voltage between the power supply voltage not inclusive and the ground voltage not inclusive.

9. The semiconductor memory device of claim 8, wherein the intermediate voltage is ½ of VDD where VDD is the power supply voltage.

10. A semiconductor memory device comprising:
   a data holding circuit configured to store data using a first circuit element and a second circuit element having different sizes and connected to different power supplies;
   a CMOS switch including a P-channel MOS transistor and an N-channel MOS transistor and configured to connect the data holding circuit and a bit line; and
   a read circuit configured to read the data of the data holding circuit.

* * * * *